United States Patent

Calaway

[15] 3,688,211

[45] Aug. 29, 1972

[54] PHASE DETECTOR FOR OSCILLATOR SYNCHRONIZATION

[72] Inventor: Ward M. Calaway, Sierra Madre, Calif.

[73] Assignee: Burroughs Corporation, Detroit, Mich.

[22] Filed: Dec. 4, 1970

[21] Appl. No.: 95,079

[52] U.S. Cl. .....................331/1 A, 328/133, 331/25, 340/174.1

[51] Int. Cl. ..........................H03b 3/04, H03d 13/00

[58] Field of Search...........331/1 A, 25, 27; 307/232; 328/133, 134

[56] References Cited

UNITED STATES PATENTS

| | | | |
|---|---|---|---|
| 3,337,814 | 8/1967 | Brase et al. | 331/18 |
| 3,351,868 | 11/1967 | Farrow | 331/27 X |
| 3,383,619 | 5/1968 | Naubereit et al. | 331/27 X |
| 3,611,175 | 10/1971 | Boelke | 331/25 X |

*Primary Examiner*—Roy Lake
*Assistant Examiner*—Siegfried H. Grimm
*Attorney*—Christie, Parker & Hale

[57] ABSTRACT

A phase detector produces a control signal proportional in amplitude to the sum of first and second component signals. The first component signal is proportional in amplitude to the phase difference between a periodic reference signal and the output signal of the oscillator to be synchronized during one time interval and the second component signal is proportional in amplitude to the phase difference between the reference signal and the oscillator output signal during another time interval. The first and second component signals are produced respectively by first and second identical ramp generators that operate alternately on successive half cycles of the reference signal so that each ramp generator operates at the frequency of the reference signal. The control signal is preferably applied directly to the frequency adjusting element of the oscillator to maintain the oscillator in frequency synchronism with the reference signal.

19 Claims, 4 Drawing Figures

INVENTOR.
WARD M. CALAWAY

BY

Christie, Parker & Hale
ATTORNEYS

CONTINUED IN FIG. 3

PHASE DETECTOR FOR OSCILLATOR SYNCHRONIZATION

CROSS REFERENCE TO RELATED APPLICATIONS

This application is related my applications Ser. No. 95,077 and Ser. No. 95,206, filed concurrently herewith, and to a commonly owned application of Peter L. Krause, Ser. No. 122,544, filed Mar. 9, 1971, which is a streamlined continuation of application Ser. No. 780,160, filed Nov. 29, 1968.

BACKGROUND OF THE INVENTION

This invention relates to synchronization of an oscillator output signal to a periodic reference signal and, more particularly, to a phase detector that is especially well suited for such synchronization.

A number of electronic applications call for phase or frequency synchronization of the output signal from a controllable high frequency oscillator to a periodic reference signal. One such application is found in disc file and drum memory systems, where synchronization with different reference signals derived from one of a number of clock tracks must be repeatedly established in the course of operation. In this application, synchronization must be established rapidly in order to prevent undue delays in the information storage or retrieval operations.

Ordinarily, the central component of a synchronization system is a phase detector to which the reference signal and the signal to be synchronized are applied. The output of the phase detector is coupled as a control signal to the oscillator to be synchronized, thereby changing its frequency until synchronization is achieved. The conventional phase detectors that sense the phase difference between the two applied signals at one instant during each cycle of the reference signal produce a large ripple component at the frequency of operation. In order to suppress this ripple component, a low pass filter is employed. The speed of response of the synchronization system is limited by the cut-off frequency of the filter. According to one known technique that permits the speed of response of the synchronization system to be doubled for the same degree of ripple suppression, a phase comparison of two binary signals is performed twice each cycle — once at each signal transition. Consequently, the principal ripple component occurs at twice the frequency of operation so the cut-off frequency of the filter can essentially be doubled. Unfortunately, this technique is not effective if the reference signal is asymmetrical because an excessive ripple component occurs at the frequency of operation.

One specific prior art system, which is disclosed in D. R. Brase et al U.S. Pat. No. 3,337,814, employs a pair of ramp generators that alternately sense the phase difference between the two applied signals during opposite half cycles of the reference signal. The output signals from the ramp generators are applied to an analog OR gate. The signal at the output of the OR gate represents the phase difference between the applied signals during each half cycle of the reference signal in turn. In this sense, the scheme may be denominated single phase detection. If the reference signal is asymmetrical, an overlap of the output signals from the ramp generators takes place, which results in ripple at the frequency of operation.

The above-identified Krause application discloses a synchronization system in which a double phase detection technique is employed. In other words, a signal representative of the phase difference between the two applied signals during one time interval is combined with a signal representative of the phase difference during another time interval to form a control signal that adjusts the oscillator frequency. Specifically, the Krause application teaches that a signal representative of the phase difference during one cycle is subtracted from a signal representative of twice the phase difference during the next subsequent cycle. The same ramp generator is employed to sense the phase difference during each cycle, a delay network and operational amplifiers being employed to combine the two signals.

SUMMARY OF THE INVENTION

In contrast, the invention involves a double phase detection that produces a control signal proportional in amplitude to the average phase difference between two applied periodic signals during two successive time intervals, which could be alternate half cycles of one of the applied signals. As a result, the control signal produced by the phase detector remains constant when the frequency of the two applied periodic signals is the same despite the fact that one of the applied periodic signals is asymmetrical. In other words, the effect of the asymmetry of the one applied periodic signal is averaged out by the phase detector.

Specifically, the control signal produced by a phase detector is proportional in amplitude to the sum of first and second component signals. The first component signal is proportional in amplitude to the phase difference between a periodic reference signal and the output signal of an oscillator to be synchronized during one time interval, e.g., every other half-cycle of the reference signal, and the second component signal is proportional in amplitude to the phase difference between the reference signal and the oscillator output signal during another time interval, e.g., the complementary half-cycles of the reference signal. The first and second component signals, which have the same constant of proportionality, are additively combined to form the control signal.

A feature of the invention is the use of first and second identical ramp generators that operate alternately to produce the first and second component signals, respectively. This mode of operation is made possible by the fact that the two component signals are weighted equally when they are combined to form the control signal. The ramp generators each operate at one-half of the frequency of the overall synchronization system, i.e., at one-half the rate of the correction of the oscillator.

BRIEF DESCRIPTION OF THE DRAWINGS

The features of a specific embodiment of the best mode contemplated for carrying out the invention are illustrated in the drawings, in which.

DETAILED DESCRIPTION OF THE DRAWINGS

Figure 1:
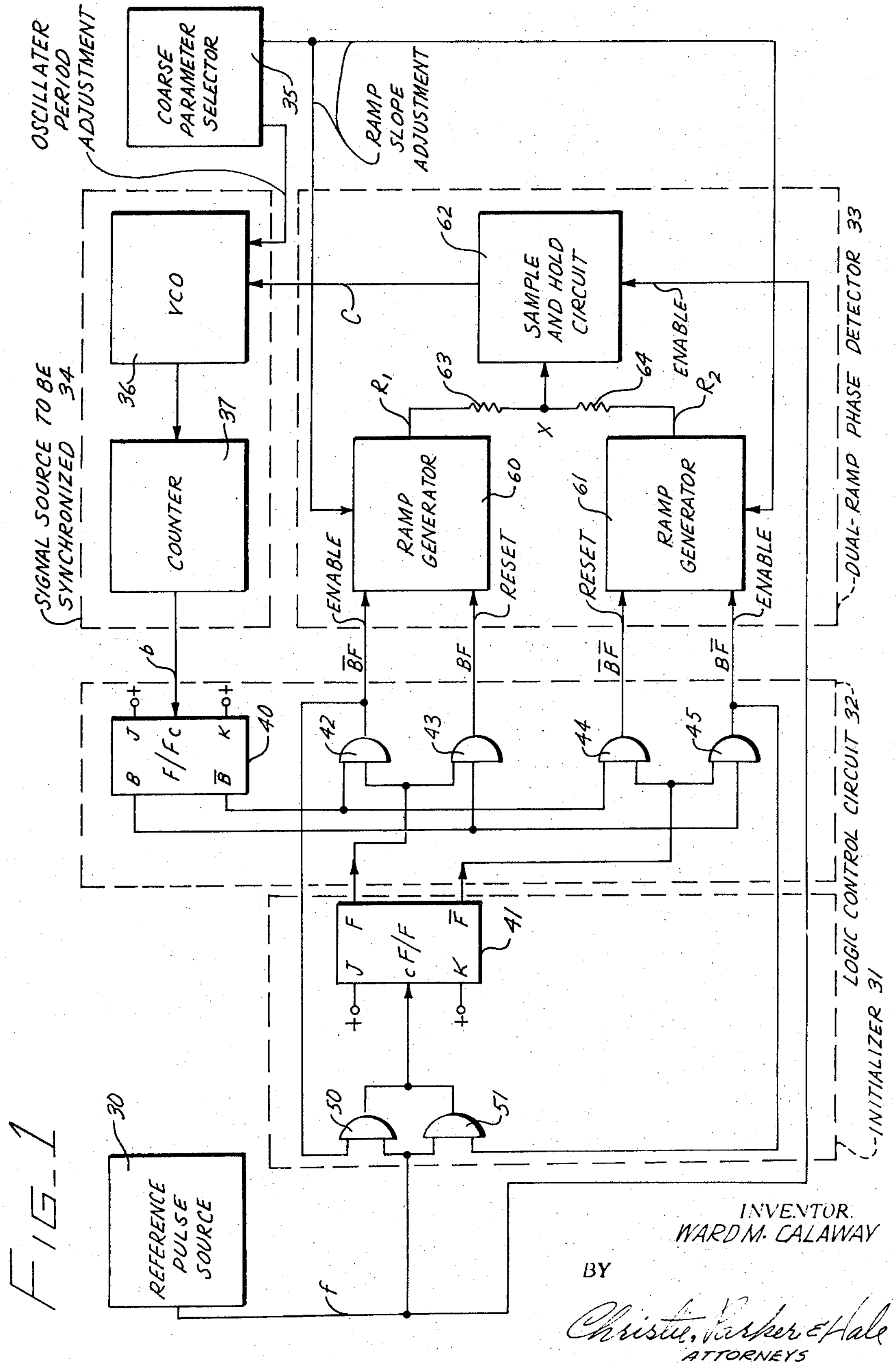
FIG. 1 is a schematic block diagram of a synchronization system incorporating the principles of the invention.

In FIG. 1 there is shown a synchronization system comprising a reference pulse source 30, an initializer 31, a logic control circuit 32, a dual-ramp phase detector 33, a signal source 34 to be synchronized, and a coarse parameter selector 35.

Figure 2:
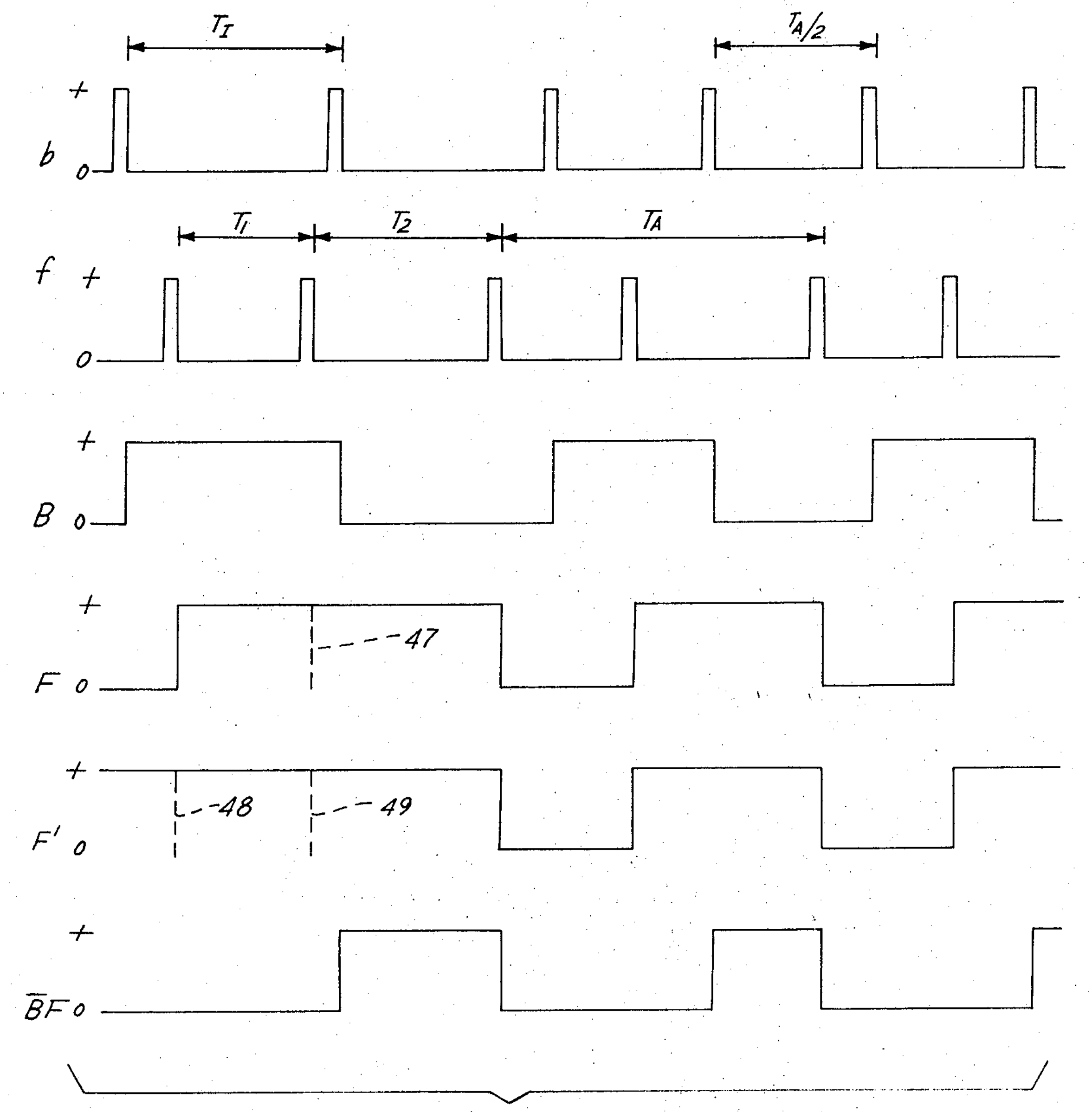
FIGS. 2 and 3 are diagrams of voltage-time waveforms that appear at different points in the synchronization system of FIG. 1.

Signal source 34 comprises a voltage controller oscillator 36 and a counter 37 connected to the output of oscillator 36. Counter 37 serves as a frequency divider for the pulses produced by oscillator 36 so one pulse appears at the output of counter 37 for every larger number of pulses appearing at the output of oscillator 36. In other words, counter 37 scales down the number of pulses produced by oscillator 36. It is assumed the scaling factor *k* of counter 37 is 10. The pulses appearing at the output of counter 37 are represented in FIG. 2 by waveform *b*. Counter 37 is not essential to the broader aspects of the invention; its purpose is to facilitate the recovery of data from a disc file memory system, as explained in more detail below in connection with FIG. 4.

Figure 3:
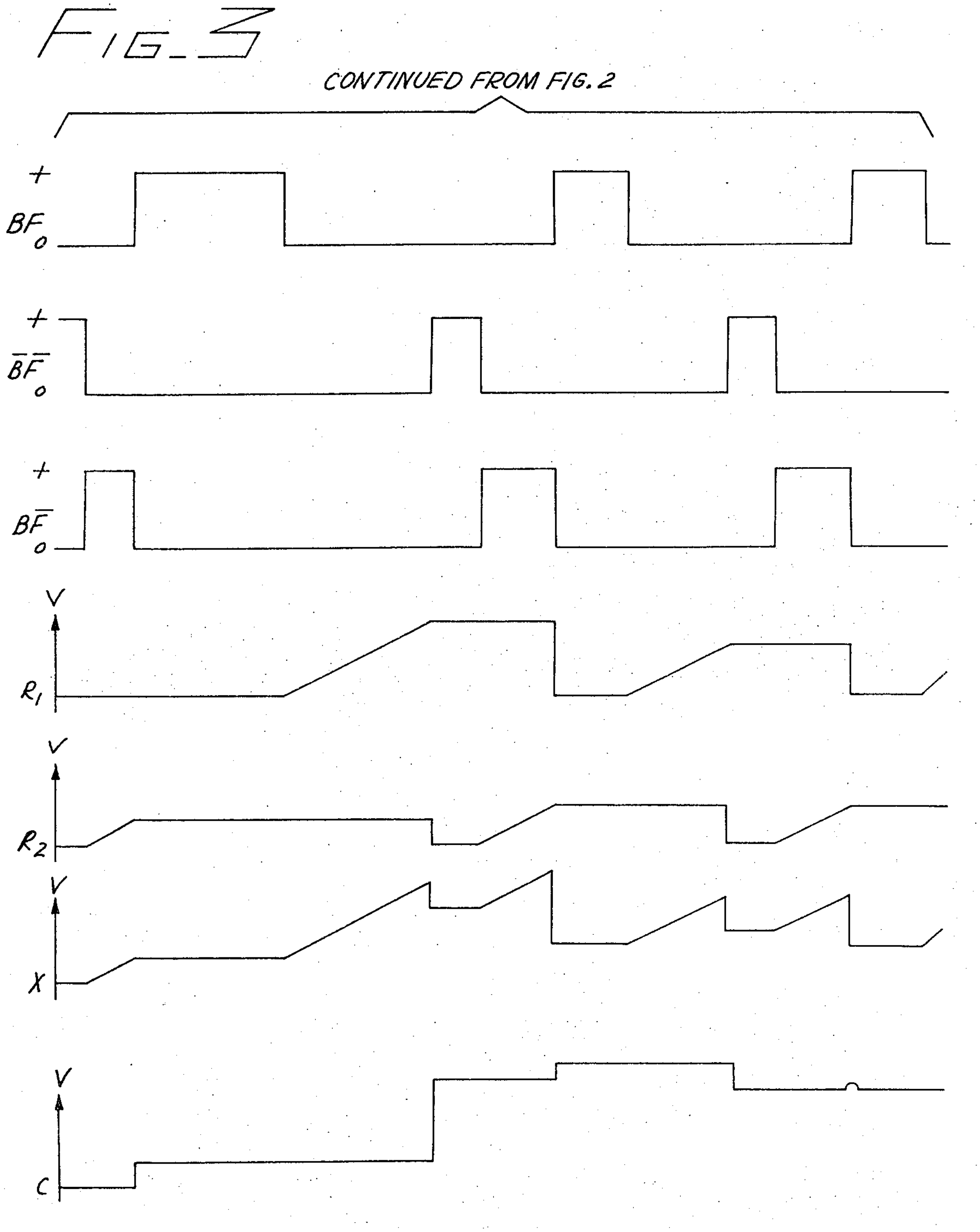

Logic control circuit 32 comprises a J-K flip-flop 40, an AND gate 42, an AND gate 43, an AND gate 44, and an AND gate 45. Initializer 31 comprises a J-K flip-flop 41, an AND gate 50, and an AND gate 51. Flip-flops 40 and 41 are bistable devices having J, C, and K inputs and B and $\overline{B}$ outputs, in the case of flip-flop 40, and F and $\overline{F}$ outputs in the case of flip-flop 41. For the purpose of illustrating the operation of the invention, it is assumed that flip-flops 40 and 41, AND gates 42 through 45, 50 and 51, and all other binary circuits and signals in FIG. 1, are either at a positive potential or at ground potential. The J and K inputs of flip-flops 40 and 41 are both connected to a source of positive potential. Accordingly, when the C input of these flip-flops experiences a transition from positive to ground potential, which occurs at the end of each pulse applied thereto, the flip-flop changes state, e.g., the B output changes from a positive potential to ground potential and the $\overline{B}$ output changes from ground to positive potential, or vice versa. Thus, as connected, flip-flops 40 and 41 serve to divide by two the frequency of the pulses applied to their C inputs and to convert the waveform to a square wave. The output of counter 37 is connected to the C input of flip-flop 40. The $\overline{B}$ output of flip-flop 40 is connected to one input of AND gate 42 and to one input of AND gate 44, while the B output of flip-flop 40 is connected to one input of AND gate 43 and to one input of AND gate 45. The F output of flip-flop 41 is connected to the other input of AND gate 42 and to the other input of AND gate 43, while the $\overline{F}$ output of flip-flop 41 is connected to the other input of AND gate 44 and to the other input of AND gate 45. The binary signals appearing at the B output of flip-flop 40, the F output of flip-flop 41, the output of AND gate 42, the output of AND gate 43, the output of AND gate 44, and the output of AND gate 45 are represented in FIGS. 2 and 3 respectively by waveforms B, F, $\overline{B}$F, BF, $\overline{BF}$, and B$\overline{F}$. As depicted by the waveforms in FIGS. 2 and 3, the output of AND gate 42 is at a positive potential only when the $\overline{B}$ output of flip-flop 40 and the F output of flip-flop 41 are at a positive potential; the output of AND gate 43 is at a positive potential only when the B output of flip-flop 40 and the F output of flip-flop 41 are at a positive potential; the output of AND gate 44 is at a positive potential only when the $\overline{B}$ output of flip-flop 40 and the $\overline{F}$ output of flip-flop 41 are at a positive potential; and the output of AND gate 45 is at a positive potential only when the B output of flip-flop 40 and the $\overline{F}$ output of flip-flop 41 are at a positive potential.

Reference pulse source 30 produces asymmetrical periodic pulses represented by waveform *f* in FIG. 2. This asymmetry is typical of the clock pulses recovered from the clock track of a disc file memory system. As depicted, the time interval $T_1$ between one pair of successive pulses is different from the time interval $T_2$ between the following pair of successive pulses, although the sum of $T_1$ and $T_2$, i.e., TA, is substantially constant. It is in this sense that the reference pulses produced by source 30 are asymmetrical. TA is the average period of the reference pulses from source 30, i.e., $T_1+T_2$.

Initializer 31, which comprises AND gate 50 and AND gate 51, functionally shares AND gates 42 and 45 with logic control circuit 32. The output of source 30 is connected to one input of AND gate 50 and one input of AND gate 51. The output of AND gate 42 is connected to the other input of AND gate 50 and the output of AND gate 45 is connected to the other input of AND gate 51. The outputs of AND gates 50 and 51 are both coupled to the C input of flip-flop 41 so flip-flop 41 changes state each time the output of AND gate 50 or the output of AND gate 51 undergoes a transition from positive to ground potential. As discussed in more detail below and my above-referenced application Ser. No. 95,206, initializer 31 serves to control flip-flop 41 so its outputs change state in a proper phase relationship relative to the outputs of flip-flop 40. Specifically, initializer 31 insures that the B output of flip-flop 40 always leads the F output of flip-flop 41 in phase by less than 180°.

Dual ramp phase detector 33 comprises a conventional ramp generator 60, a conventional ramp generator 61, and a conventional sample and hold circuit 62, which are arranged to function together in a unique manner in accordance with the invention. Ramp generators 60 and 61 are identical; each has an ENABLE input and a RESET input, ramp generator 60 has an output $R_1$, and ramp generator 61 has an output $R_2$. The ramp generators integrate the potential at their respective inputs until the RESET input is actuated. When a transition from ground to a positive potential occurs at the ENABLE input, a ramp generator produces at its output a potential with a constant slope that increases until a transition from positive to ground potential occurs at the ENABLE input. This potential is then held at the output of the ramp generator until a transition from ground to a positive potential occurs at the RESET input of the ramp generator, at which time the output of the ramp generator returns to ground potential. In other words, ramp generators 60 and 61 serve as time to voltage converters; the potential at the output in the holding interval between each transition from positive to ground potential at the ENABLE input and the following ground to positive transition at the RESET input is proportional to the duration of the previous positive potential pulse applied to the ENABLE input.

The output of AND gate 42 is coupled to the ENABLE input of ramp generator 60 and the output of AND gate 43 is coupled to the RESET input of ramp generator 60. As depicted by the waveforms in FIG. 2, the duration of the positive potential pulses appearing at the output of AND gate 42 is proportional to the time interval between the negative-going, i.e., positive to ground, transitions of the B output of flip-flop 40 and the negative-going transitions of the F output of flip-flop 41. Thus, the output potential of ramp generator 60 during the holding interval is proportional to the phase difference between the states of flip-flops 40 and 41 during every other half cycle of the operation of flip-flop 41. The output of AND gate 45 is coupled to the ENABLE input of ramp generator 61 and the output of AND gate 44 is coupled to the RESET input of ramp generator 61. As depicted by the waveforms in FIGS. 2 and 3, the duration of the positive potential pulses appearing at the output of AND gate 45 is proportional to the time interval between the positive-going, i.e., ground to positive, transitions of the B output of flip-flop 40 and the positive-going transitions of the F output of flip flop 41. Thus, the output potential of ramp generator 61 during the holding interval is proportional to the phase difference between the states of flip-flops 40 and 41 during every other complementary half cycle of the operation of flip-flop 41. The constants of proportionality of the output potentials of ramp generators 60 and 61 are identical, i.e., for a given phase difference both ramp generators produce the same output potential. As depicted by the waveforms of FIGS. 2 and 3, ramp generator 60 is reset each time a positive-going transition of the F output of flip-flop 41 occurs. This insures that ramp generator 60 is ready to measure the time interval between the next negative-going transitions at the B output of flip-flop 40 and the F output of flip-flop 41, because the B output always leads the F output in phase by less than 180°. As depicted by the waveforms in FIGS. 2 and 3, ramp generator 61 is reset each time a negative-going transition of the F output of flip-flop 41 occurs. This insures that ramp generator 61 is ready to measure the time interval between the next positive-going transitions at the B output of flip-flop 40 and the F output of flip-flop 41, because the B output always leads the F output in phase by less than 180°.

The outputs $R_1$ and $R_2$ of ramp generators 60 and 61 are coupled by identical resistors 63 and 64 to a junction point X that is connected to the input of sample and hold circuit 62. The output of source 30 is coupled to an ENABLE input of sample and hold circuit 62. Thus, at each negative-going transition of the reference pulses from source 30, circuit 62 is reset and the instantaneous value of the potential appearing at junction point X is sampled. Alternatively, the outputs of AND gates 50 and 51 could be coupled to the ENABLE input of sample and hold circuit 62. As depicted by waveform C in FIG. 3, the signal appearing at the output of sample and hold circuit 62 changes at each sampling instant to a value that is proportional to the instantaneous value of the sampled potential and remains constant during the interval between samples at such value. As depicted by waveforms $R_1$, $R_2$, and X in FIG. 3, the potential at junction point X is the sum of the potentials at outputs $R_1$ and $R_2$. As further depicted by these waveforms, at each negative-going transition of the reference pulses from source 30, the output of one of the ramp generators has just reached its peak value at the beginning of the holding interval and the output of the other ramp generator is about to be reset at the end of the holding interval. By sampling the potential at junction point X at this instant in time, as does circuit 62, each sample is proportional to the sum of the phase difference between the states of flip-flops 40 and 41 at two different times, namely during successive half cycles of flip-flop 41.

In summary, the output of sample and hold circuit 62 constitutes the output of phase detector 33 and produces a control signal proportional to the phase difference between the reference pulses from source 30 and the pulses from counter 37. The asymmetry of the reference pulses from source 30, which manifests itself in different values of successive measured time intervals (i.e., different values of the phase difference during successive half cycles of the signal at the F output of flip-flop 41), is averaged out by combining the output signals of ramp generators 60 and 61 at junction point X. As depicted by the transitions of waveform C, the principal ripple component occurs at twice the frequency of operation of flip-flop 41.

The output of sample and hold circuit 62 is coupled to a period or frequency control input of voltage controlled oscillator 36, which is designed to respond to the entire frequency spectrum of the control signal below the frequency of the principal ripple component. Oscillator 36 could be the circuit disclosed in my referenced application Ser. No. 95,077. The signal appearing at the output of circuit 62 continues to change at each sampling instant until the frequency of the pulses appearing at the output of counter 37 is precisely equal to the frequency of the reference pulses from source 30, after which the control signal remains constant at the precise value required to hold the frequency of oscillator 36 in synchronism with a multiple of the frequency of source 30, the multiple being equal to the scaling factor $k$ of counter 37. Waveforms $b$ and $f$ depict the output pulses of counter 37 and reference pulse source 30 respectively, during establishment of frequency synchronization by the system of FIG. 1. Initially, the period of the pulses produced at the output of counter 37 is some arbitrary value $T_I$. Once frequency synchronization is established, the period of the pulses produced at the output of counter 37 equals one-half the average period $T_A$ of the reference pulses from source 30. No fluctuations occur in the control signal produced at the output of sample and hold circuit 62 as the phase difference between individual pulses of waveform $b$ and waveform $f$ changes due to the asymmetry of waveform $f$. This is attributable to the averaging accomplished by combining the outputs from ramp generators 60 and 61 and by sampling the resultant signal at the instants in time when it is representative of the average of the phase difference on successive half cycles of flip-flop 41.

Coarse parameter selector 35 is coupled to voltage controlled oscillator 36, ramp generator 60, and ramp generator 61. When it is desired to synchronize the system of FIG. 1 to a new source of reference pulses having a frequency in a different range from the reference pulses to which the system was previously synchronized, selector 35 furnishes to voltage controlled oscillator 36 a coarse oscillator period adjustment signal that brings the frequency of oscillator 36 to a nominal frequency close to the multiple *k* of the new frequency of the reference pulses. Similarly, selector 35 provides a ramp slope adjustment signal to ramp generators 60 and 61 to change the slope of the ramps they generate to a value that is appropriate for the new frequency of source 30. Thereafter, the described synchronization system brings voltage controlled oscillator 36 into synchronism with the multiple *k* of the frequency of the new source of reference pulses.

The mode of operation of ramp generators 60 and 61 described above depends upon the existence of a proper phase relationship between the change in states of flip-flops 40 and 41, namely that the B output of flip-flop 40 always leads the F output of flip-flop 41 in phase by less than 180°. This phase relationship is maintained by initializer 31. It should be noted that if the B output were permitted to lead the F output by more than 180°, i.e. the F output would lead the B output by less than 180°, logic control circuit 32 would not control the ENABLE and RESET inputs of ramp generators 60 and 61 in the proper way.

First, the roles of ramp generators 60 and 61 would be reversed, ramp generator 60 measuring the time interval between the positive-going transitions of the B and F outputs and ramp generator 61 measuring the time interval between the negative-going transitions of the B and F outputs. This reversal of roles would bring about a change in direction of the slope of the response characteristic of phase detector 33, which would cause phase detector 33 to adjust oscillator 36 in the wrong direction to bring about frequency synchronization. In other words, the synchronization system would become regenerative. Second, the ramp generators would be reset too soon to permit the integrated potentials generated by both ramp generators to appear simultaneously. For example, if the F output leads the B output by less than 180°, ramp generator 61 measures the time interval between each negative-going transition at the B and F outputs and is reset immediately by AND gate 45 when the negative going transition occurs at the B output.

The output signals from AND gates 42 and 45 serve both to enable ramp generators 60 and 61, respectively, and AND gates 50 and 51, respectively. This inherently prevents flip-flop 41 from operating outside of its proper phase relationship relative to flip-flop 40. In other words, AND gates 50 and 51 control the transmission of reference pulses from source 30 to the C input of flip-flop 41 such that the B output of flip-flop 40 always leads the F output of flip-flop 41 in phase by less than 180°. This inherency can be understood from the following considerations: AND gate 42 does not provide an enabling signal to AND gate 50 unless the B output of flip-flop 40 is at ground potential and the F output of flip-flop 41 is at a positive potential. When these two conditions co-exist, in other words, when the F output lags the B output in phase by less than 180°, flip-flop 41 changes state responsive to the next reference pulse from source 30 so its F output assumes ground potential. AND gate 45 does not provide an enabling signal to AND gate 51 unless the F output of flip-flop 41 is at ground potential and the B output of flip-flop 40 is at a positive potential. When these two conditions co-exist, in other words, when the F output lags the B output in phase by less than 180°, flip-flop 41 changes state responsive to the next reference pulse from source 30 so its F output assumes a positive potential.

Thus, AND gates 50 and 51 force flip-flop 41 to maintain the proper phase relationship relative to flip-flop 40. In FIG. 2 the B output and the F output are initially both at ground potential, so the first reference pulse from source 30 shown passes through AND gate 51 after the B output assumes a positive potential. Then, however, due to the large initial discrepancy in period between the *b* and *f* waveforms, the proper phase relationship is lost and the second reference pulse from source 30 fails to be coupled to the C input of flip-flop 41. At the point in time when the second reference pulse occurs, which is represented by a dashed line 47 on waveform F, flip-flop 41 does not change state. By the time the third reference pulse occurs, the proper phase relationship is reestablished and flip-flop 41 changes state responsive to this reference pulse. Waveform F′ illustrates the operation of initializer 31 in the case where the F output of flip-flop 41 is initially at a positive potential. In this case, at the time of occurrence of the first two reference pulses, represented respectively by a dashed line 48 and a dashed line 49 on waveform F′, no transition takes place in the state of flip-flop 41. By the time the third reference pulse occurs, the proper phase relationship is established and flip-flop 41 changes state. Initializer 31 operates in the same manner to reestablish the proper phase relationship when a disturbance occurs in the system after synchronization has once been achieved. Basically, when the proper phase relationship is lost, the state of flip-flop 41 is shifted in phase by 180°, thereby reestablishing the proper phase relationship.

Figure 4:
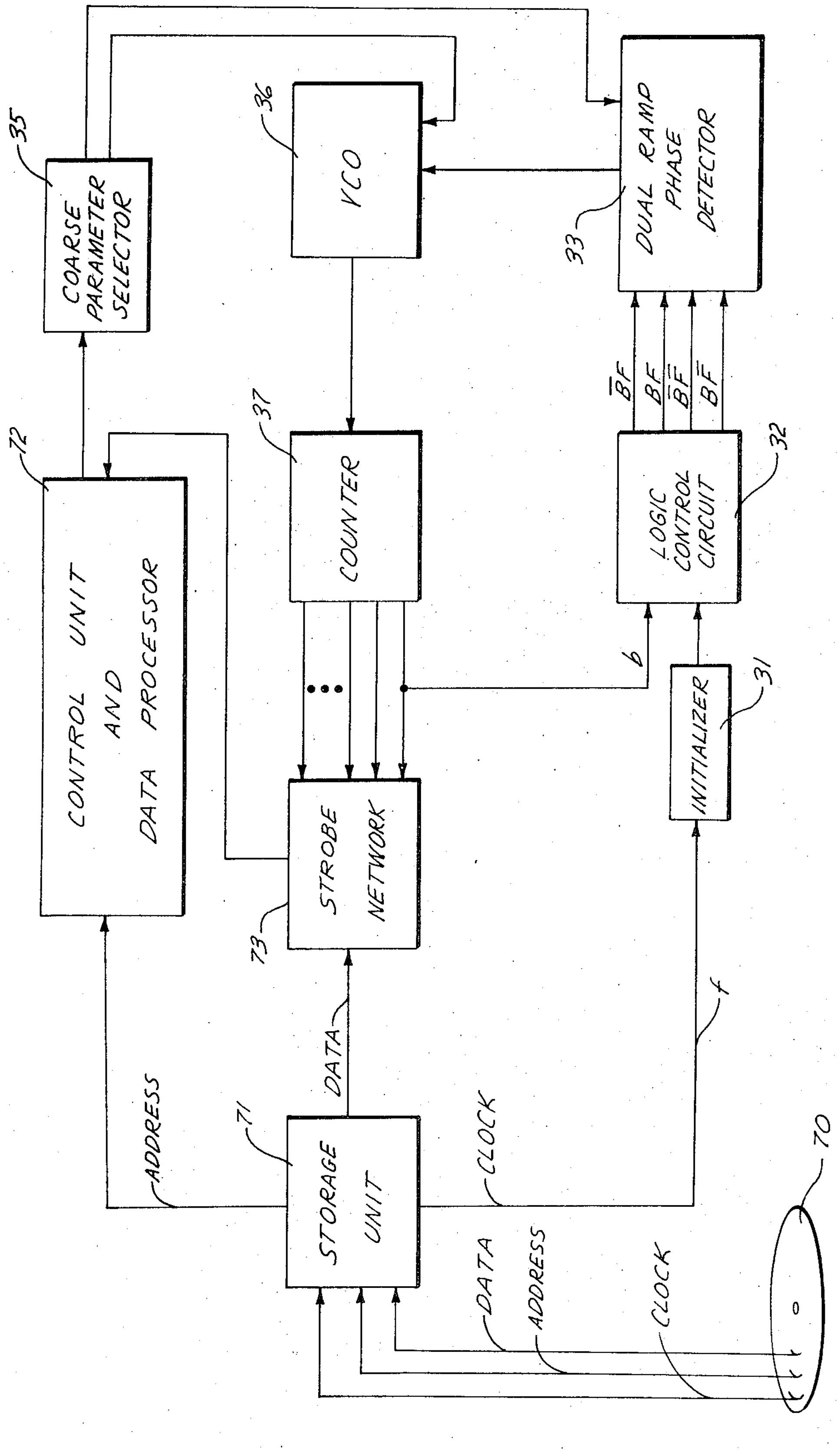
FIG. 4 is a schematic block diagram of a disc file memory system that incorporates the synchronization system of FIG. 1.

In FIG. 4 initializer 31, logic control circuit 32, phase detector 33, coarse parameter selector 35, voltage controlled oscillator 36, and counter 37 are shown as part of an otherwise conventional disk file memory system. A continuously rotating disk 70 with a coating of magnetic material is coupled by magnetic transducer heads (not shown) to a storage unit 71, which contains a plurality of registers for the temporary storage of information taken from the disk until it is utilized. Disk 70 has a number of different concentric zones on which data and clock information are recorded at different densities. Accordingly, the data and clock information read from the different zones are at different frequencies. As depicted in FIG. 4, data, address information, and clock information are coupled from disk 70 to storage unit 71. From there, the address information is routed to a control unit and data processor 72, which controls the data storage on and retrieval from the disk file memory system, the data is routed to a strobe network 73, and the clock information in the form of asymmetrical pulses, as illustrated by waveform *f* of FIG. 2, is routed to initializer 31. The storage and retrieval of data are controlled by control unit and data processor 72. Whenever it is desired to store data on or retrieve data from a particular zone of disk 70, control unit and data processor 72 gives an appropriate command to coarse parameter selection 35 so as to couple an oscillator period adjustment signal to voltage controlled oscillator 36 and ramp slope adjustment signals to phase detector 33. Control unit and data processor 72 also actuates the appropriate magnetic transducer heads to communicate with the selected zone of disk 70. Thereafter, the clock information associated with the selected zone of disk 70 is coupled to initializer 31 as the reference pulses to which one state of counter 37 is synchronized. As depicted in FIG. 4, all $k$, e.g. 10, stages of counter 37 are coupled to strobe network 73 and one of the stages is coupled to logic control circuit 32 to supply thereto pulses as waveform $b$ of FIG. 2. After frequency synchronization is established in the course of data retrieval, strobe network 73 selects one of the states of counter 37 to strobe the data signal received from storage unit 71, depending upon which state of counter 37 corresponds to a reference bit or pulse occurring at the start of each record of data on disk 70.

Regenerated data pulses produced by strobe network 73 responsive to the selected state of counter 37 are coupled to control unit and data processor 72. The make-up of strobe network 73 and the details of the reference bit are described in detail in co-pending application Ser. No. 660,485 filed Aug. 14, 1967, by L. O. Anderson et al which matured into Pat. 3,537,075, on Oct. 27, 1970.

The invention can also be employed with a disk file memory system in the course of data storage. In this case, the invention could comprise the synchronizer described in a co-pending application of Peter L. Krause, Ser. No. 80,092, entitled INFORMATION STORAGE AND RETRIEVAL, and filed on Oct. 12, 1970.

The invention has been disclosed in connection with a frequency synchronization system where one train of pulses is brought into precise frequency synchronism with another train of pulses, although the phase relationship between the two trains of frequency synchronized pulses may vary as the conditions in the system vary. For example, different nominal operating frequencies of voltage-controlled oscillator 36 imposed by the oscillator period adjustment signal from selector 35 would normally result in frequency synchronization to the reference pulses with different phase offsets. The invention could also be employed in other applications where a phase detector is required. One such application is a phase synchronization system such as that disclosed in application Ser. No. 122,544. In such case, the output of the phase detector would be integrated to form the control signal that adjusts the period of the oscillator to be synchronized.

The described embodiment of the invention is only considered to be preferred and illustrative of the inventive concept; the scope of the invention is not to be restricted to such an embodiment. Various and numerous arrangements may be devised by one skilled in the art without departing from the spirit and scope of this invention. For example, the constant of proportionality of the component signals combined at junction point X could be maintained identical by adjusting the values of resistors 63 and 64 to compensate for different slopes in ramp generators 60 and 61.

What is claimed is:

1. A synchronization system comprising:
- a first source of periodic signals;
- a second source of periodic signals, the period of the second source being adjustable in response to a control signal;
- means for generating a first component signal proportional in amplitude to the phase difference between the periodic signals from the first and second sources during one time interval;
- means for generating a second component signal proportional in amplitude to the phase difference between the periodic signals from the first and second sources during a time interval subsequent to the said one time interval, the constant of proportionality of the first and second component signals being identical;
- means responsive to the first and second component signals for producing a control signal proportional to the sum thereof; and
- means for coupling the control signal to the second source to adjust its period relative to the period of the first source to establish a predetermined relationship therebetween.

2. The synchronization system of claim 1, in which the first source of periodic signals is asymmetrical, the first component signal generating means generates a first component signal proportional in amplitude to the phase difference between the periodic signals from the first and second sources during one half cycle of one of the periodic signals, and the second component signal generating means generates a second component signal proportional in amplitude to the phase difference between the periodic signals from the first and second sources during the half cycle of the said one periodic signal immediately subsequent to the said one half cycle.

3. The synchronization system of claim 1, in which the first source of periodic signals is asymmetrical, the first component signal generating means generates a first component signal proportional in amplitude to the phase difference between the periodic signals from the first and second sources during alternate half cycles of one of the periodic signals, and the second component signal generating means generates a second component signal proportional in amplitude to the phase difference between the periodic signals from the first and second sources during the complementary alternate half cycles of the said one periodic signal.

4. The synchronization system of claim 3, in which:
- the periodic signals from the first and second sources are binary squarewave signals;
- the first component signal generating means comprises first means for producing pulses proportional in duration to the time interval between the positive-going transitions of the periodic signals from the first and second sources and second means for producing a potential proportional in amplitude to the duration of the pulses produced by the first means; and
- the second component signal generating means comprises first means for producing pulses proportional in duration to the time interval between the negative-going transitions of the periodic signals from the first and second sources and second means for producing a potential proportional in amplitude to the duration of the pulses produced by the first means the second component signal generating means.

5. The synchronization system of claim 4, in which: the second means of the first component signal generating means comprises a first ramp generator enabled responsive to the pulses produced by the first means thereof and reset responsive to the negative-going transitions of one of the periodic signals; and the second means of the second component signal generating means comprises a second ramp generator enabled responsive to the pulses produced by the first means thereof and reset responsive to the positive-going transitions of the said one periodic signal.

6. The synchronization system of claim 5, in which the means for producing a control signal comprises means for additively combining the output signals of the ramp generators and means for sampling the combined output signals of the ramp generators at each transition of the said one periodic signal prior to reset of the ramp generators.

7. The synchronization system of claim 6, in which: one of the sources comprises a first binary circuit having a first output and a second output; the other source comprises a second binary circuit having a first output and a second output; the first means of the first component signal generating means comprises a first AND gate having inputs to which the first output of the second binary circuit and the second output of the first binary circuit are connected and the first ramp generator is reset responsive to the output of a second AND gate having inputs to which the second output of the first binary circuit and the second output of the second binary circuit are connected; and the first means of the second component signal generating means comprises a third AND gate having inputs to which the second output of the second binary circuit and the first output of the first binary circuit are connected and the second ramp generator is reset responsive to the output of a fourth AND gate having inputs to which the first output of the first binary circuit and the first output of the second binary circuit are connected.

8. The synchronization system of claim 7, in which: the first source is the first binary circuit; and means are provided for controlling the first binary circuit so it lags the second binary circuit in phase by less than 180°.

9. The synchronization system of claim 8, in which: the first binary circuit is a flip-flop that changes state each time a pulse is applied to its input; and the means for controlling the first binary circuit comprises a source of pulses and means for coupling the source of pulses to the flip-flop to change its state responsive to the first and third AND gates such that pulses from the pulse source are coupled to the flip-flop only when the state of the flip-flop lags the state of the second binary circuit by less than 180°.

10. The synchronization system of claim 9, in which means are provided for making a coarse adjustment of the period of the second source and a corresponding adjustment of the constant of proportionality of the first and second component signal generating means.

11. The synchronization system of claim 1, in which means are provided for permitting the first and second signal components to change only when a selected one of the periodic signals leads the other periodic signal by less than 180°.

12. The synchronization system of claim 1, in which means are provided for making a coarse adjustment of the period of the second source and a corresponding adjustment of the constant of proportionality of the first and second component signal generating means.

13. The synchronization system of claim 1, in which the control signal is directly applied to the second source to establish frequency synchronization between the periodic signals.

14. A phase detector for producing a signal proportional to the phase difference between a first periodic signal and a second periodic signal, the phase detector comprising:

means for generating a first component signal proportional in amplitude to the time interval between given points on the first and second periodic signals during one cycle of one of the periodic signals;

means for generating a second component signal proportional in amplitude to the time interval between given points on the first and second periodic signals during a subsequent cycle of the said one periodic signal, the constant of proportionality of the first and second component signals being identical; and means responsive to the first and second component signals for producing a control signal proportional to the sum thereof.

15. A phase detector responsive to the phase between two periodic signals comprising:

means for generating a first repetitive ramp signal, the peak of which is representative of the phase difference between the two periodic signals during alternate intervals of time related to the frequency of one of the periodic signals;

means for generating a second repetitive ramp signal, the peak of which is representative of the phase difference between the two periodic signals during alternate intervals of time complementary to the intervals during which the first ramp signal is generated and related to the frequency of the one periodic signal; and means for generating an output signal simultaneously representative of the peaks of both the first and second ramp signals.

16. The phase detector of claim 15, in which the means for generating an output signal comprises:

means for additively combining the first and second ramp signals;

means for periodically sampling the combined signal at intervals when both ramp signals are at their peaks; and means for storing the sampled signal between sampling intervals.

17. The phase detector of claim 16, in which the intervals of the first and second ramp generating means are alternate half cycles of the one periodic signal.

18. The phase detector of claim 17, in which the two periodic signals are binary square waves and the means for generating a first ramp signal is enabled during coincidence in time of one of the periodic signals with the complement of the other periodic signal.

19. The phase detector of claim 18, in which the means for generating a first ramp signal is reset upon the coincidence in time of both periodic signals.

* * * * *